(12) United States Patent
Jung et al.

(10) Patent No.: US 6,385,126 B2
(45) Date of Patent: May 7, 2002

(54) CLOCK SYNCHRONIZATION CIRCUIT AND SEMICONDUCTOR DEVICE HAVING THE SAME

(75) Inventors: Yeon-jae Jung, Sachun; Seung-wook Lee, Sungdong-gu; Dae-yun Shim, Kwangmyung; Won-chan Kim, Seoul, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/757,792

(22) Filed: Jan. 11, 2001

(30) Foreign Application Priority Data

Jan. 22, 2000 (KR) ................................. 00-3064

(51) Int. Cl.[7] ................................. G11C 8/00
(52) U.S. Cl. ................................. 365/233; 365/194
(58) Field of Search ................................. 365/233, 194

(56) References Cited

U.S. PATENT DOCUMENTS

| | | | | |
|---|---|---|---|---|
| 6,130,584 A | * | 10/2000 | Yoshida | 331/11 |
| 6,134,670 A | * | 10/2000 | Mahalingaiah | 713/401 |
| 6,181,093 B1 | * | 1/2001 | Park et al. | 318/254 |
| 6,229,861 B1 | * | 5/2001 | Young | 375/356 |

FOREIGN PATENT DOCUMENTS

| | | | | |
|---|---|---|---|---|
| JP | 0038996 | * | 3/1984 | G11C/11/34 |
| JP | 0079491 | * | 5/1984 | G11C/17/00 |

OTHER PUBLICATIONS

Betty Prince, "Semiconductor Memories", 1983, Wiley, 2nd pp. 166–167.*

* cited by examiner

Primary Examiner—David Nelms
Assistant Examiner—M. Tran
(74) Attorney, Agent, or Firm—F. Chau & Associates, LLP

(57) ABSTRACT

A clock synchronization circuit is provided for synchronizing an external clock signal with an internal clock signal. The circuit is connected to a clock buffer adapted to output the internal clock signal. The circuit includes a first loop adapted to receive the external clock signal and output a plurality of reference clock signals having a predetermined phase difference therebetween. A second loop is adapted to delay the plurality of reference clock signals; select a signal from among the plurality of delayed reference clock signals; provide the selected signal to the clock buffer; detect a phase difference between the internal clock signal output from the clock buffer and the external clock signal; generate a plurality of control voltages to reduce the detected phase difference, and control a delay amount of each of the plurality of reference clock signals in response to the plurality of control voltages; so as to synchronize the internal clock signal with the external clock signal.

20 Claims, 9 Drawing Sheets

NORMAL OPERATION RANGE

CLOCK SYNCHRONIZATION CIRCUIT AND SEMICONDUCTOR DEVICE HAVING THE SAME

TECHNICAL FIELD

The present invention relates generally to semiconductor devices and, in particular, to a clock synchronization circuit and a semiconductor device having the same.

BACKGROUND DESCRIPTION

The operating speed of a central processing unit (CPU), which is a signal processing unit, has been radically improved over the last several years. However, the operating speed of dynamic random access memory (DRAM) semiconductor devices, which correspond to the main memory of a CPU, has not been greatly improved. Rather, it has been identified as a main bottle-neck factor of computer systems. To reduce the difference in operating speed between a CPU and a DRAM semiconductor device, new DRAM semiconductor devices are being developed such as synchronous DRAM (SDRAM) semiconductor devices, Rambus DRAM semiconductor devices, synclink DRAM semiconductor devices, and so forth. These DRAM semiconductor devices have a feature such that data received from an external source or output to the outside is processed in synchronization with an internal clock. The internal clock is generated from an external clock signal which is received from an external source. A circuit which synchronizes the internal clock signal with the external clock signal is referred to as a clock synchronization circuit. A phase locked loop and a delay locked loop are included in the clock synchronization circuit. Among them, the delay locked loop is usually used in the DRAM semiconductor devices.

FIG. 1 is a block diagram of a clock synchronization circuit 101 according to the prior art. Referring to FIG. 1, the clock synchronization circuit 101 has a dual loop structure having a core delay locked loop 111 and a peripheral delay locked loop 113. The core delay locked loop 111 receives an external clock signal inCLK and generates 6 sub clock signals CK1 through CK6 (hereinafter collectively referred to as "CK1–CK6"). The sub clock signals CK1–CK6 have a predetermined phase difference. The peripheral delay locked loop 113 receives the sub clock signals CK1–CK6, generates a clock signal Q, and synchronizes the clock signal Q with an external clock signal inCLK using a phase interpolation technique. The peripheral delay locked loop 113 includes a phase selector 121, a selection phase transformer 131, a phase interpolator 141, a phase detector 151 and a controller 161. The phase interpolator 141 interpolates the phases of signals Φ' and Ψ' output from the selective phase transformer 131 to generate the clock signal Q. The phase interpolator 141 receives 16 bits of signals output from the controller 161 in order to determine the degree of interpolation of the phase of the clock signal Q.

The phase interpolation technique used by the conventional clock synchronization circuit 101 can achieve its effects when the slew rate of an external clock signal inCLK is small, or when a smaller phase boundary can be provided by increasing the number of sub-clock signals CK1–CK6 generated by the core delay locked loop 111. However, in the former case, the dynamic noise sensitivity of the clock synchronization circuit 101 is increased, so that jitter performance is degraded. In the latter case, a burden on the clock synchronization circuit 101 is increased.

Accordingly, it would be desirable and highly advantageous to have a clock synchronization circuit having improved jitter performance.

SUMMARY OF THE INVENTION

The problems stated above, as well as other related problems of the prior art, are solved by the present invention, a clock synchronization circuit and a semiconductor device having the same. Both the clock synchronization circuit and semiconductor device have improved jitter performance with respect to prior art devices.

According to a first aspect of the invention, there is provided a clock synchronization circuit for synchronizing an external clock signal with an internal clock signal. The circuit is connected to a clock buffer adapted to output the internal clock signal. The circuit includes: a first loop adapted to receive the external clock signal and output a plurality of reference clock signals having a predetermined phase difference therebetween; and a second loop adapted to delay the plurality of reference clock signals, select a signal from among the plurality of delayed reference clock signals, provide the selected signal to the clock buffer, detect a phase difference between the internal clock signal output from the clock buffer and the external clock signal, generate a plurality of control voltages to reduce the detected phase difference, and control a delay amount of each of the plurality of reference clock signals in response to the plurality of control voltages, so as to synchronize the internal clock signal with the external clock signal.

According to a second aspect of the invention, there is provided a clock synchronization circuit for synchronizing an external clock signal with an internal clock signal. The circuit is connected to a clock buffer. The circuit includes: a first loop adapted to receive the external clock signal and output first through fourth reference clock signals, consecutive pairs of the first through fourth reference clock signals having a 90° phase difference therebetween; and a second loop having first through fourth voltage control delay units adapted to delay the first through fourth reference clock signals, the second loop adapted to select a reference clock signal from among the first through fourth delayed reference clock signals, provide the selected reference clock signal to the clock buffer for conversion to the internal clock signal, detect a phase difference between the internal clock signal output from the clock buffer and the external clock signal, generate a plurality of control voltages having different levels according to the detected phase difference to reduce the detected phase difference, provide the plurality of control voltages to the first through fourth voltage control delay units, and control the delay amount of the selected reference clock signal in response to a control voltage from among the plurality of control voltages, so as to synchronize the internal clock signal with the external clock signal.

According to a third aspect of the invention, a level of the control voltage applied to a voltage control delay unit among the first through fourth voltage control delay units that outputs the selected reference clock signal is different from levels of other control voltages from among the plurality of control voltages applied to other voltage control delay units among the first through fourth voltage control delay units that generate unselected reference clock signals.

According to a fourth aspect of the invention, delay amounts applied to the first through fourth reference clock signals are always detected, the selected reference clock signal is switched to an unselected one of the first through fourth delayed reference clock signals having a phase that lags a phase of the selected reference clock signal by 90° when the delay amount of the selected reference clock signal approaches a maximum value, and the selected reference clock signal is switched to an unselected one of the first through fourth delayed reference clock signals having a phase that leads the phase of the selected reference clock signal by 90° when the delay amount of the selected reference clock signal approaches a minimum value.

According to a fifth aspect of the invention, there is provided a clock synchronization circuit for synchronizing an external clock signal with an internal clock signal. The circuit is connected to a clock buffer. The circuit includes: a first loop adapted to receive the external clock signal and output a first and a second reference clock signal, the reference clock signals being differential signals having a 90° phase difference therebetween; and a second loop having a first voltage control delay unit adapted to delay the first reference clock signal to output a first and a second differential clock signal, and a second voltage control delay unit adapted to delay the second reference clock signal to output a third and a fourth differential clock signal, wherein each of the first and second voltage control delay units is controlled by one of a reference voltage and a control voltage, the second loop adapted to select a differential clock signal among the first through fourth differential clock signals output from the first and second voltage control delay units, provide the selected differential clock signal to the clock buffer, detect a phase difference between the internal clock signal output from the clock buffer and the external clock signal, and provide the control voltage to one of the first and the second voltage control delay units according to the detected phase difference to reduce the detected phase difference, so that a delay amount of the selected differential clock signal is controlled, so as to synchronize the internal clock signal with the external clock signal.

According to a sixth aspect of the invention, a level of the reference voltage is different from a level of the control voltage.

According to a seventh aspect of the invention, delay amounts of the first through fourth differential clock signals are always detected, the selected differential clock signal is switched to an unselected one of the first through fourth differential clock signals having a phase that lags the phase of the selected clock signal by 90° when the delay amount of the selected differential clock signal approaches a maximum value, and the selected differential clock signal is switched to an unselected one of the first through fourth differential clock signals having a phase that leads the phase of the selected clock signal by 90° when the delay amount of the selected differential clock signal approaches a minimum value.

According to an eighth aspect of the invention, there is provided a semiconductor device including: a clock buffer adapted to output an internal clock signal suitable for internal use by the semiconductor device; a first loop adapted to receive the external clock signal and output a plurality of reference clock signals having a predetermined phase difference therebetween; and a second loop adapted to delay the plurality of reference clock signals, select a signal from among the plurality of delayed reference clock signals, provide the selected signal to the clock buffer for conversion to the internal clock signal, detect a phase difference between the internal clock signal output from the clock buffer and the external clock signal, generate a plurality of control voltages to reduce the detected phase difference, and control a delay amount of each of the plurality of reference clock signals in response to the plurality of control voltages, so as to synchronize the internal clock signal with the external clock signal.

According to a ninth aspect of the invention, the semiconductor device is a synchronous dynamic random access memory (SDRAM) semiconductor device.

According to a tenth aspect of the invention, there is provided a semiconductor device including: a clock buffer adapted to output an internal clock signal suitable for internal use by the semiconductor device; a first loop adapted to receive an external clock signal and output first through fourth reference clock signals having a 90° phase difference therebetween; and a second loop having first through fourth voltage control delay units adapted to delay the first through fourth reference clock signals, the second loop adapted to select a reference clock signal among the first through fourth reference clock signals output from the first through fourth voltage control delay units and provide the selected reference clock signal to the clock buffer for conversion to the internal clock signal, detect a phase difference between the internal clock signal output from the clock buffer and the external clock signal, generate a plurality of control voltages having different levels according to the detected phase difference to reduce the detected phase difference, provide the plurality of control voltages to the first through fourth voltage control delay units, and control delay amounts of the first through fourth reference clock signals in response to the plurality of control voltages, so as to synchronize the internal clock signal with the external clock signal.

According to an eleventh aspect of the invention, there is provided a semiconductor device including: a clock buffer adapted to output an internal clock signal suitable for internal use by the semiconductor device; a first loop adapted to receive an external clock signal and output first and second reference clock signals of differential types having a 90° phase difference therebetween; and a second loop having a first voltage control delay unit adapted to delay the first reference clock signal to output a first and a second differential clock signal, and a second voltage control delay unit adapted to delay the second reference clock signal to output a third and a fourth differential clock signal, wherein each of the first and second voltage control delay units is controlled by one of a reference voltage and a control voltage, the second loop adapted to select a signal among the first through fourth differential clock signals output from the first and second voltage control delay units, provide the selected signal to the clock buffer for conversion to the internal clock signal, detect a phase difference between the internal clock signal output from the clock buffer and the external clock signal, and provide the control voltage to one of the first and the second voltage control delay units according to the detected phase difference to reduce the detected phase difference, so that a delay amount of the selected signal is controlled, so as to synchronize the internal clock signal with the external clock signal.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
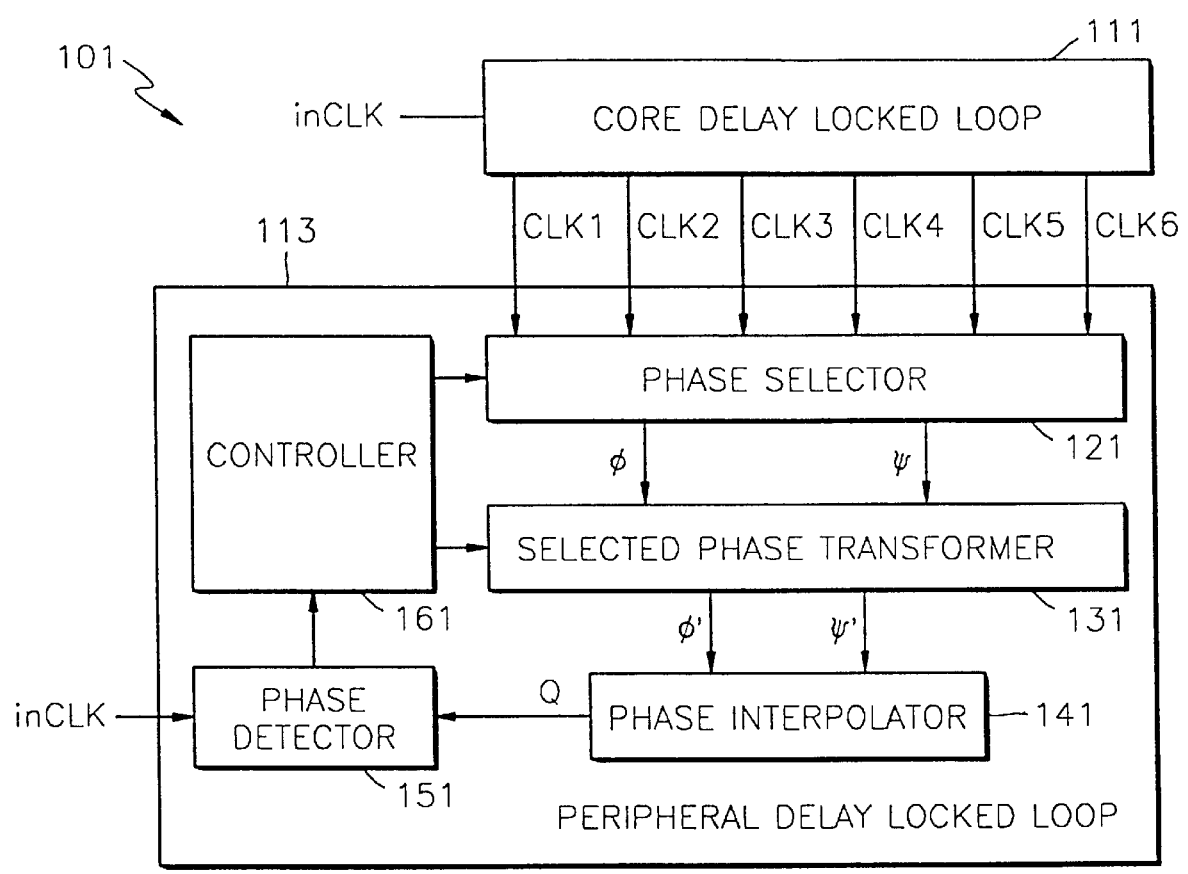
FIG. 1 is a block diagram of a clock synchronization circuit according to the prior art.

It is to be understood that the present invention may be implemented in various forms of hardware, software, firmware, special purpose processors, or a combination thereof. Preferably, the present invention is implemented as a combination of both hardware and software, the software being an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) which is executed via the operating system. In addition, various other peripheral devices may be connected to the computer platform such as an additional data storage device.

It is to be further understood that, because some of the constituent system components depicted in the accompanying Figures may be implemented in software, the actual connections between the system components may differ depending upon the manner in which the present invention is programmed. Given the teachings herein, one of ordinary skill in the related art will be able to contemplate these and similar implementations or configurations of the present invention.

A general description of the present invention will now be provided to introduce the reader to the concepts of the invention. Subsequently, more detailed descriptions of various aspects of the invention will be provided with respect to FIGS. 2 through 10.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the scope of the present invention to those skilled in the art. In the entire specification, like reference numerals denote the same members. Furthermore, each embodiment disclosed and described in this specification includes a conductive-type embodiment that is complementary to each embodiment.

Figure 2:
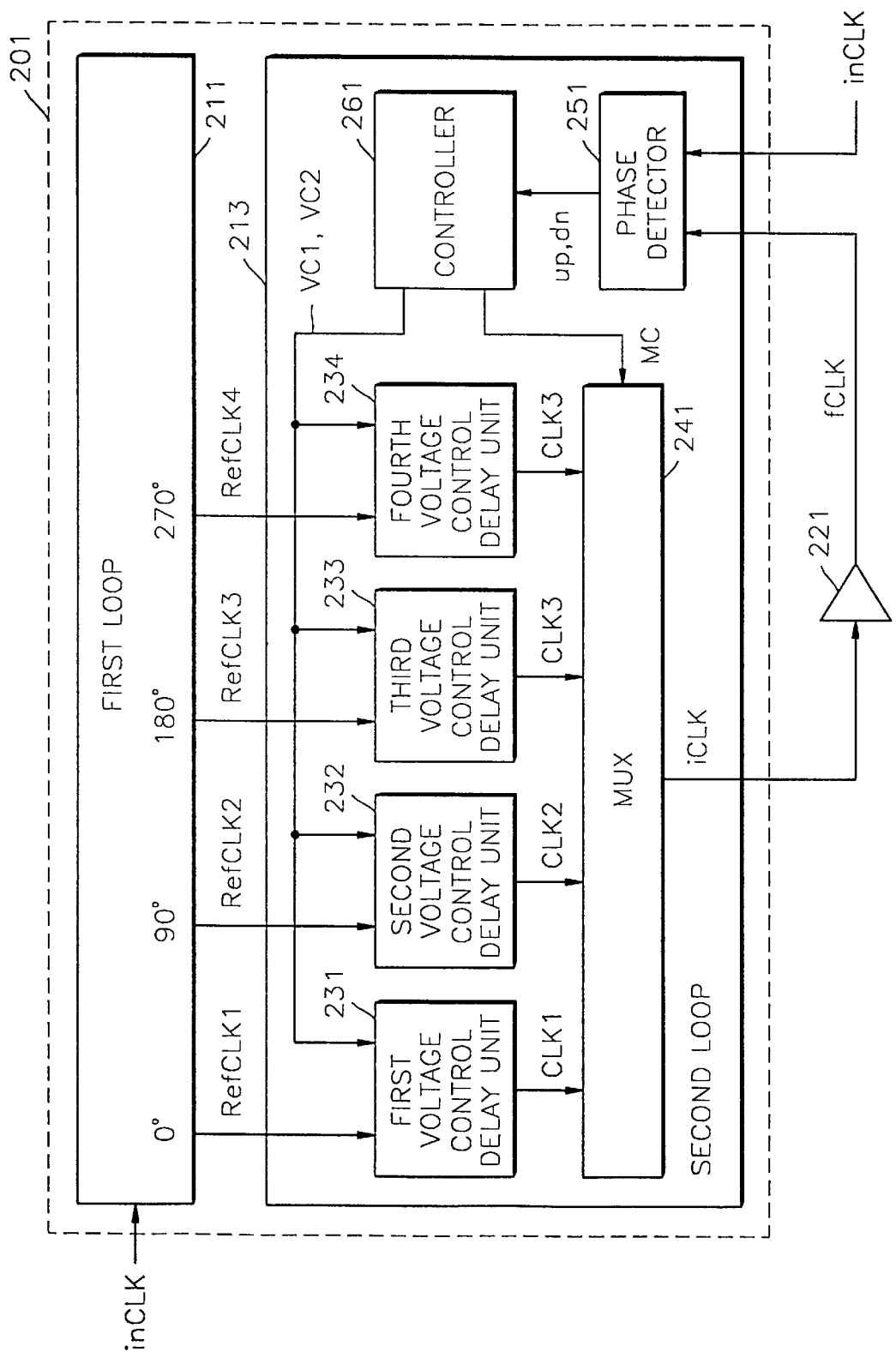
FIG. 2 is a block diagram illustrating a clock synchronization circuit according to an illustrative embodiment of the invention together with a clock buffer.

FIG. 2 is a block diagram illustrating a clock synchronization circuit 201 according to an illustrative embodiment of the invention together with a clock buffer 221. The clock synchronization circuit 201 includes first and second loops 211 and 213. The first loop 211 receives an external clock signal inCLK and generates first through fourth reference clock signals RefCLK1 through RefCLK4 (hereinafter collectively referred to as "REFCLK1–REFCLK4"). Each consecutive pair of the first through fourth reference clock signals RefCLK1–RefCLK4 have a phase difference of 90 degrees. That is, the phase of the second reference clock signal RefCLK2 lags the phase of the first clock signal RefCLK1 by 90 degrees, the phase of the third reference clock signal RefCLK3 lags the phase of the second reference clock signal RefCLK2 by 90 degrees, and the phase of the fourth reference clock signal RefCLK4 lags the phase of the third reference clock signal RefCLK3 by 90 degrees. If the number of the clock reference clock signal RefCLK1 through RefCLK4 is increased, the phase difference between the reference clock signals RefCLK1 through RefCLK4 is reduced.

The second loop 213 receives the first through fourth reference clock signals RefCLK1 through RefCLK4 and outputs a clock signal iCLK. That is, the second loop 213 controls the delay amounts of the first through fourth reference clock signals RefCLK1 through RefCLK4 using an analog control voltage, and synchronizes an internal clock signal fCLK with an external clock signal inCLK. The second loop 213 selects one among the first through fourth clock signals CLK1–CLK4 obtained by controlling the delay amounts of the first through fourth reference clock signals RefCLK1–RefCLK4, and provides the selected clock signal as a clock signal iCLK to the clock buffer 221.

Figure 3:
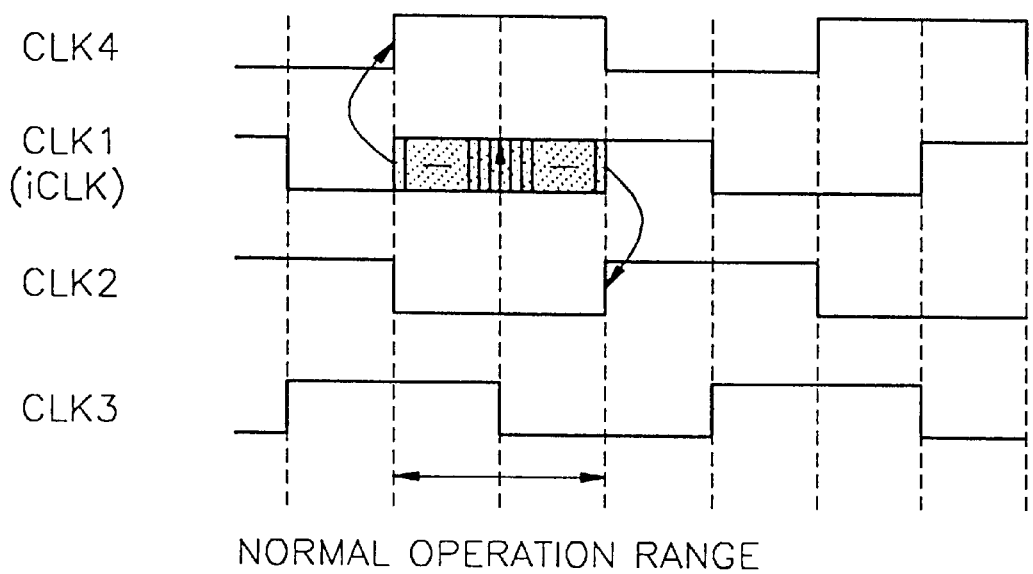
FIG. 3 is a timing diagram illustrating clock switching of the second loop of FIG. 2 according to an illustrative embodiment of the invention.

As shown in FIG. 3, which is a timing diagram illustrating clock switching of the second loop 213 of FIG. 2 according to an illustrative embodiment of the invention, when the delay amount of the selected clock signal iCLK increases and approaches a maximum value or when the delay amount thereof decreases and approaches a minimum value, the selected clock signal is switched to another clock signal. For example, if the delay amount of the first clock signal CLK1 approaches the maximum value in a state where the first clock signal CLK1 has been selected, the first clock signal CLK1 is switched to the second clock signal CLK2, while the first, third and fourth clock signals CLK1, CLK3 and CLK4 return to the original phase relationship provided from the first loop 211. If the delay amount of the first clock signal CLK1 approaches the minimum value, the first clock signal CLK1 is switched to the fourth clock signal CLK4. As described above, the selected clock signal iCLK is switched to another clock signal before it reaches the limit of the maximum value or minimum value of its delay amount, whereby the total phase region can be covered.

Referring back to FIG. 2, the second loop 213 includes first through fourth voltage control delay units 231 through 234, a multiplexer 241, a phase detector 251 and a controller 261.

Figure 4:
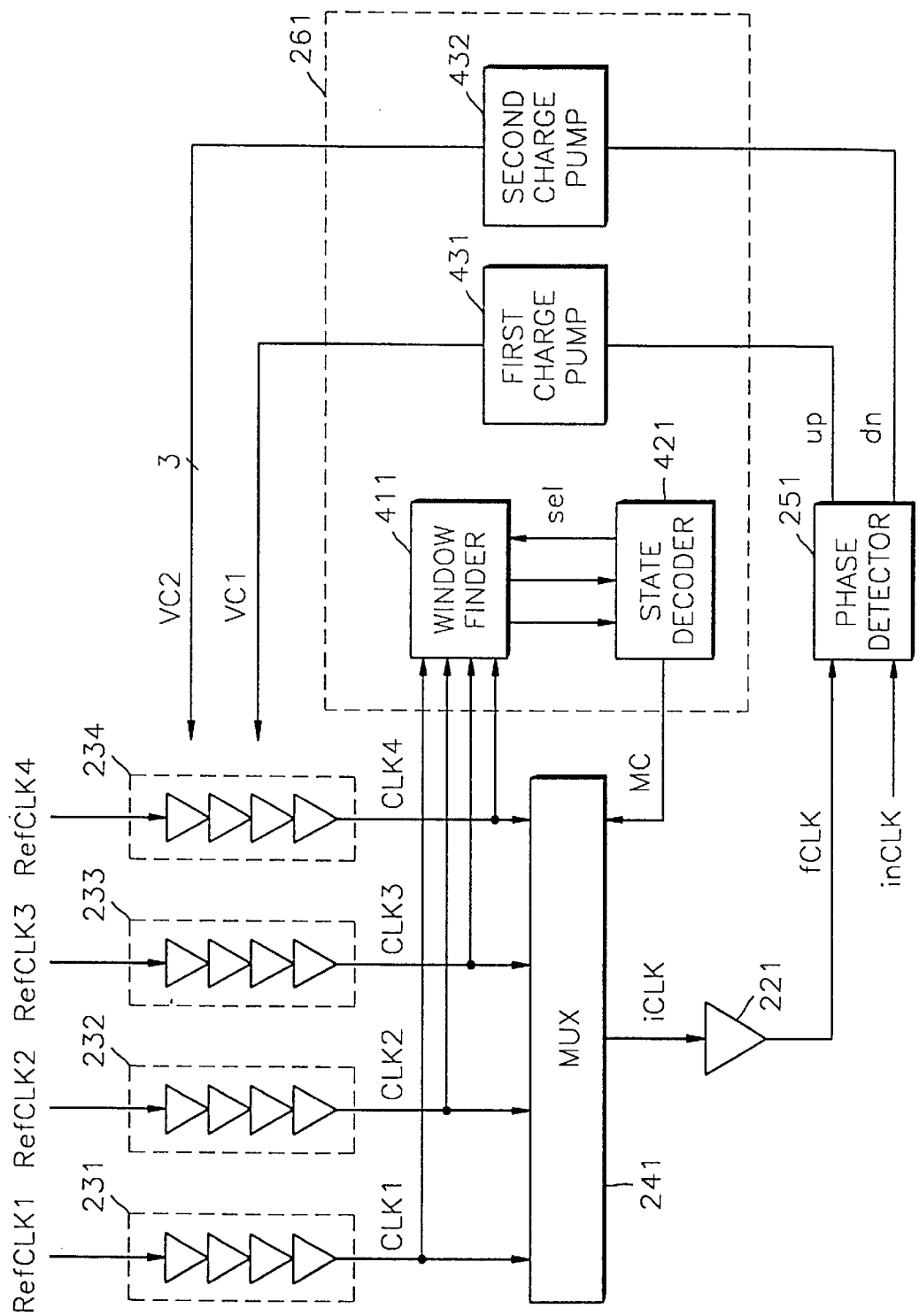
FIG. 4, which is a block diagram illustrating the second loop of FIG. 2 in further detail according to an illustrative embodiment of the invention.

The first through fourth voltage control delay units 231 through 234 delay the first through fourth reference clock signals RefCLK1–RefCLK4, respectively, output from the first loop 211. Each of the first through fourth voltage control delay units 231 through 234 consists of four delay elements, as shown in FIG. 4, which is a block diagram illustrating the second loop 213 of FIG. 2 in further detail according to an illustrative embodiment of the invention. Among the first through fourth voltage control delay units 231 through 234, a voltage control delay unit for outputting a selected clock signal iCLK is controlled by a control voltage which is different from control voltages by which voltage control delay units for outputting non-selected clock signals are controlled. For example, if the first clock signal CLK1 is selected, a control voltage VC1 supplied from the controller 261 to the first voltage control delay unit 231 is different from control voltages VC2 supplied to the second through fourth voltage control delay units 232 through 234. The control voltages VC2, which are supplied to the second through fourth voltage control delays 232 through 234 for outputting non-selected clock signals, are the same.

In the first through fourth voltage control delay units 231 through 234, the delay time for each of the first through fourth clock signals CLK1–CLK4 varies with the number of delay elements included in each of the delay units. That is, when a large number of delay elements are provided, the delay time for each of the first through fourth clock signals CLK1 through CLK4 becomes long (i.e., increasing the number of delay units increases the delay time). On the other hand, when a small number of delay elements are provided, the delay time for each of the first through fourth clock signals CLK1 through CLK4 becomes short (i.e., decreasing the number of delay units decreases the delay time). Also, the delay amount of each of the first through fourth clock signals CLK1 through CLK4 varies with the sizes of the control voltages VC1 and VC2 applied to the first through fourth voltage control delay units.

Figure 6A:
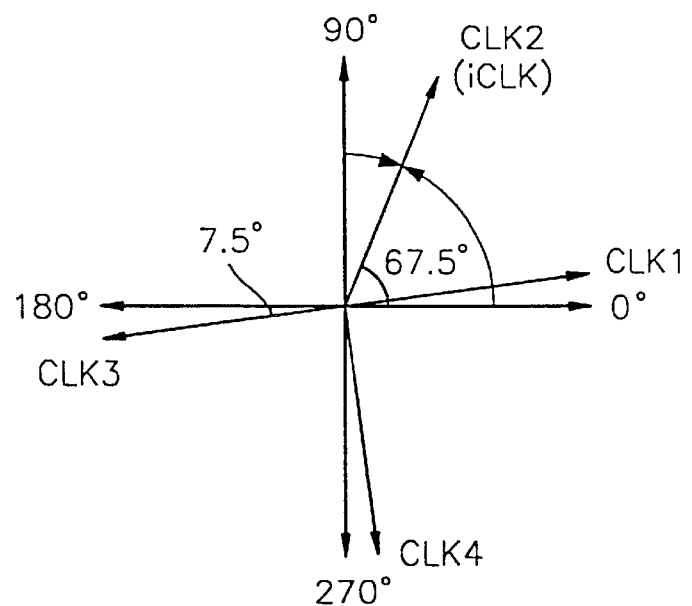
FIGS. 6A and 6B, which are phase diagram illustrating the delay control methods performed by the first through fourth voltage control delay units of FIG. 2 according to an illustrative embodiment of the invention.
Figure 6B:
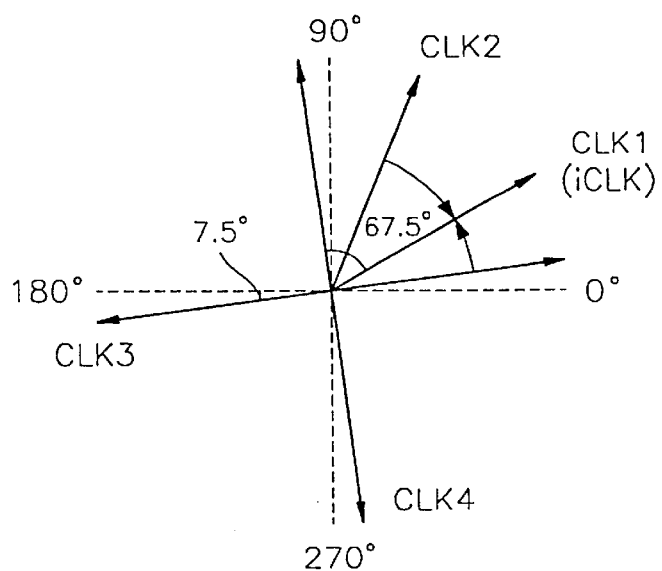

A delay control method of the first through fourth voltage control delay units 231 through 234 will now be described with reference to FIGS. 6A and 6B, which are phase diagram illustrating the delay control methods performed by the first through fourth voltage control delay units 231 through 234 of FIG. 2 according to an illustrative embodiment of the invention. FIG. 6A refers to the case where the delay amount of the selected clock signal iCLK increases, and FIG. 6B refers to the case where the delay amount of the selected clock signal iCLK decreases. The selected clock signal iCLK is delayed within the delay control range of the first through fourth voltage control delay units 231 through 234. The selected clock signal iCLK must be switched to another clock signal before its delay amount reaches the maximum or minimum value, and must be able to be continuously switched in any direction. Here, as a delay range to be covered by the first through fourth voltage control delays 231 through 234 becomes narrower, the number of delay elements included in each of the first through fourth voltage control delays 231 through 234 decreases. Thus, power consumption is reduced, and the jitter performance is improved.

When a condition occurs in which the delay variation speed of the selected clock signal iCLK is three times as fast as the delay variation speeds of three unselected clock signals, switching between the clock signals CLK1 through CLK4 can be continuously conducted in every direction. In FIG. 6A, the initial phases of the first through fourth clock signals CLK1 through CLK4 exist at 0 degree, 90 degrees, 180 degrees and 270 degrees, respectively, and the first clock signal CLK1 at 0 degree is initially selected. When the first clock signal CLK1 is rotated counterclockwise due to an increase in its delay amount, the second through fourth clock signals CLK2 through CLK4 rotate clockwise, during which the first and second clock signals CLK1 and CLK2 meet at +67.5 degrees. Then, the second clock signal CLK2 is selected as the clock signal iCLK, and the first, third and fourth clock signals CLK1, CLK3 and CLK4 are moved from the original position to a position departing by 7.5 degrees. FIG. 6B shows the case where the first clock signal CLK1 is switched to the second clock signal CLK2, and then the second clock signal CLK2 is rotated clockwise due to a decrease in its delay amount. When the second clock signal CLK2 is rotated clockwise, the first, third and fourth clock signals CLK1, CLK3 and CLK4 are rotated counterclockwise. During that time, when the first and second clock signals CLK1 and CLK2 meet each other, the first clock signal CLK1 is re-selected as the clock signal iCLK, while the second through fourth clock signals CLK2 through CLK4 are moved from the original positions to positions departing by 7.5 degrees. In this method, a delay range to be covered by a voltage control delay unit is −67.5° to +67.5°.

The multiplexer 241 is connected to the first through fourth voltage control delay units 231 through 234, and receives the first through fourth clock signals CLK1–CLK4 and selects one among the first through fourth clock signals CLK1–CLK4 in response to a control signal MC output from the controller 261.

The clock buffer 221 converts the voltage level of the clock signal iCLK output from the multiplexer 241 and outputs the internal clock signal fCLK. The clock buffer 221 is widely used in semiconductor devices, in particular, in SDRAM semiconductor devices. In this case, the clock buffer 221 converts the voltage level of the received clock signal iCLK into a voltage level suitable to the inside of SDRAM semiconductor devices to generate the internal clock signal fCLK.

The phase detector 251 receives the internal clock signal fCLK and the external clock signal inCLK, compares the phases of the two signals to each other to generate phase information signals up and dn, and provides the phase information signals up and dn to the controller 261. The phase detector 251 can be implemented by a typical phase detector.

The controller 261 receives the phase information signals up and dn, and outputs the control voltages VC1 and VC2 for controlling the delay amounts of the first through fourth voltage control delay units 231 through 234 on the basis of phase information included in the phase information signals up and dn. The controller 261 also receives the first through fourth clock signals CLK1–CLK4 output from the first through fourth voltage control delay units 231 through 234 and detects a phase window wherein the first through fourth clock signals CLK1–CLK4 exist, to determine which clock signal is to be selected by the multiplexer 241.

A detailed block diagram of the controller 261 is shown in FIG. 4 which, as noted above, is a block diagram illustrating the second loop 213 of FIG. 2 in further detail according to an illustrative embodiment of the invention. Referring to FIG. 4, the controller 261 includes a window finder 411, a state decoder 421, and first and second charge pumps 431 and 432.

Figure 7:
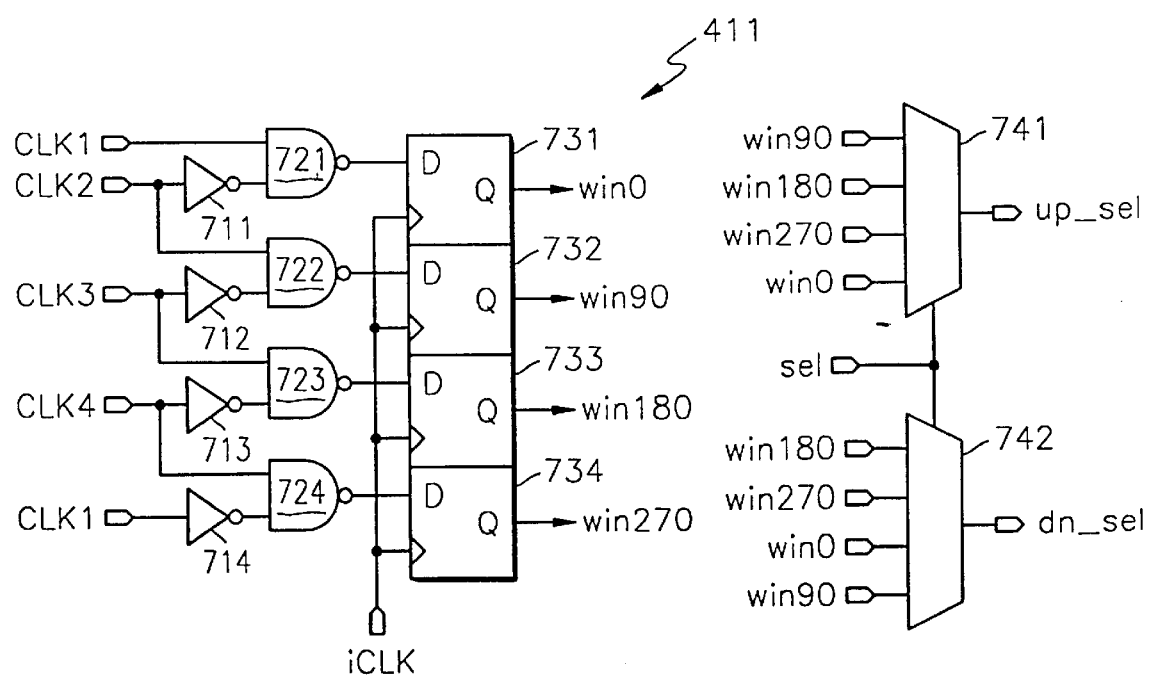
FIG. 7 is a block diagram illustrating the window finder of FIG. 4 in further detail according to an illustrative embodiment of the invention.

The window finder 411 receives the first through fourth clock signals CLK1–CLK4 and a selection code signal sel, and finds a phase window where the selected clock signal iCLK exists, thereby determining whether the current selected clock signal iCLK is to be switched. FIG. 7 is a block diagram illustrating the window finder 411 of FIG. 4 in further detail according to an illustrative embodiment of the invention. Referring to FIG. 7, the window finder 411 includes inverters 711 through 714, NAND gates 721 through 724, D flip-flops 731 through 734, and multiplexers 741 and 742. The inverters 711 through 714 and the NAND gates 721 through 724 receive the first through fourth clock signals CLK1–CLK4 and make a window between the clock edges of each of the first through fourth clock signals CLK1–CLK4. The window is sampled by the rising edge of the selected clock signal iCLK, to find a phase window where the current selected clock signal iCLK exists. The window information is output as signals up_sel and dn_sel while passing through the multiplexers 741 and 742 which are controlled by a selection code signal. If the selection code signal is '00' and the second clock signal CLK2 must be selected since the first clock signal has been selected, the signal up_sel is output to increase the current selection code signal. The window finder 411 is an important block to determine jitter upon switching between clock signals. Therefore, the structure of the window finder 411 must be designed to be as symmetrical as possible, to reduce a path mismatch between the paths of the first through fourth clock signals CLK1 through CLK4 and the path of a selected clock signal iCLK.

Referring back to FIG. 4, the state decoder 421 receives the output signals up_sel and dn_sel of the window finder 411, determines the next selection code from a current selection code, and provides a signal MC depending on the determined selection code to the multiplexer 241. Also, the state decoder 421 provides the selection code signal sel to the window finder 411.

The first and second charge pumps 431 and 432 receive the output signals up and dn of the phase detector 251 and generate differential control voltages VC1 and VC2. Here, when the first charge pump 431 is provided with the output signal up of the phase detector 251, then the second charge pump 432 is provided with the output signal dn of the phase detector 251. When the first charge pump 431 is provided with the output signal dn of the phase detector 251, then the second charge pump 432 is provided with the output signal up of the phase detector 251.

Figure 5:
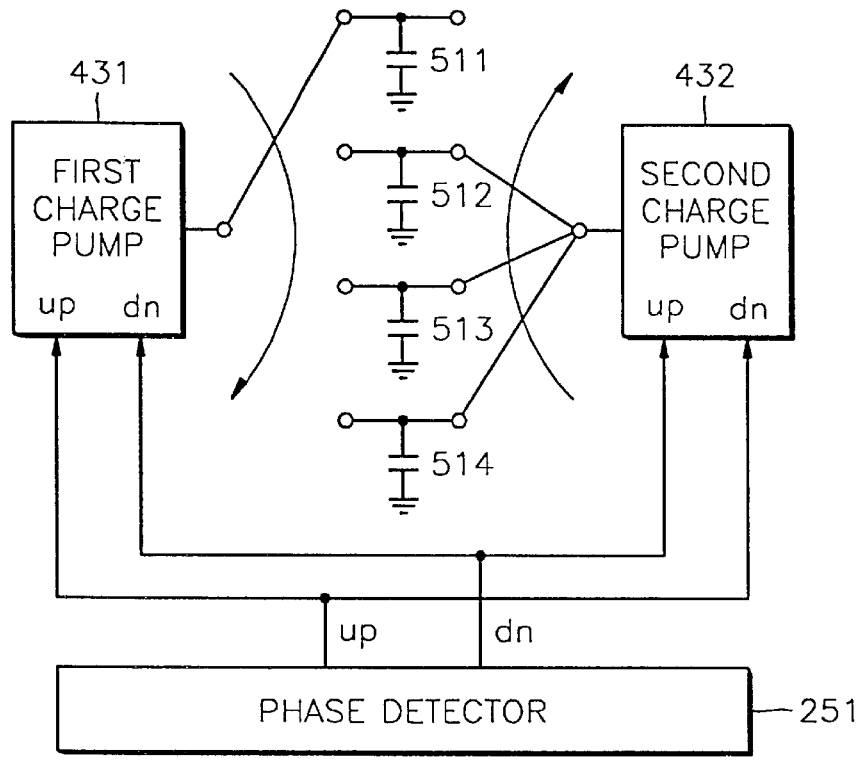
FIG. 5 is a block diagram illustrating the operations of the first and second charge pumps of FIG. 4 according to an illustrative embodiment of the invention.

FIG. 5 is a block diagram illustrating the operations of the first and second charge pumps 431 and 432 of FIG. 4 according to an illustrative embodiment of the invention. Referring to FIGS. 4 and 5, the first charge pump 431 provides the control voltage VC1 to a voltage control delay unit for generating a selected clock signal iCLK, and the second charge pump 432 provides the control voltage VC2 to voltage control delay units for generating non-selected clock signals. The first and second charge pumps 431 and 432 provide the same current. The capacitors 511 through 514 are connected to the first through fourth voltage control delay units 231 through 234, respectively. When the capacities of the capacitors 511 through 514 are all the same, a selected clock signal iCLK is delayed at a speed that is three times as fast as the delay speeds of unselected clock signals. When the selected clock signal iCLK is switched to another clock signal, the first and second charge pumps 431 and 432 are switched to corresponding capacitors, so as to provide the control voltages VC1 and VC2 to corresponding voltage control delay units 231 through 234, and charge re-distribution occurs in each capacitor, so that the delay control range of −67.5° to +67.5° shown in FIGS. 6A and 6B is established.

Figure 8:
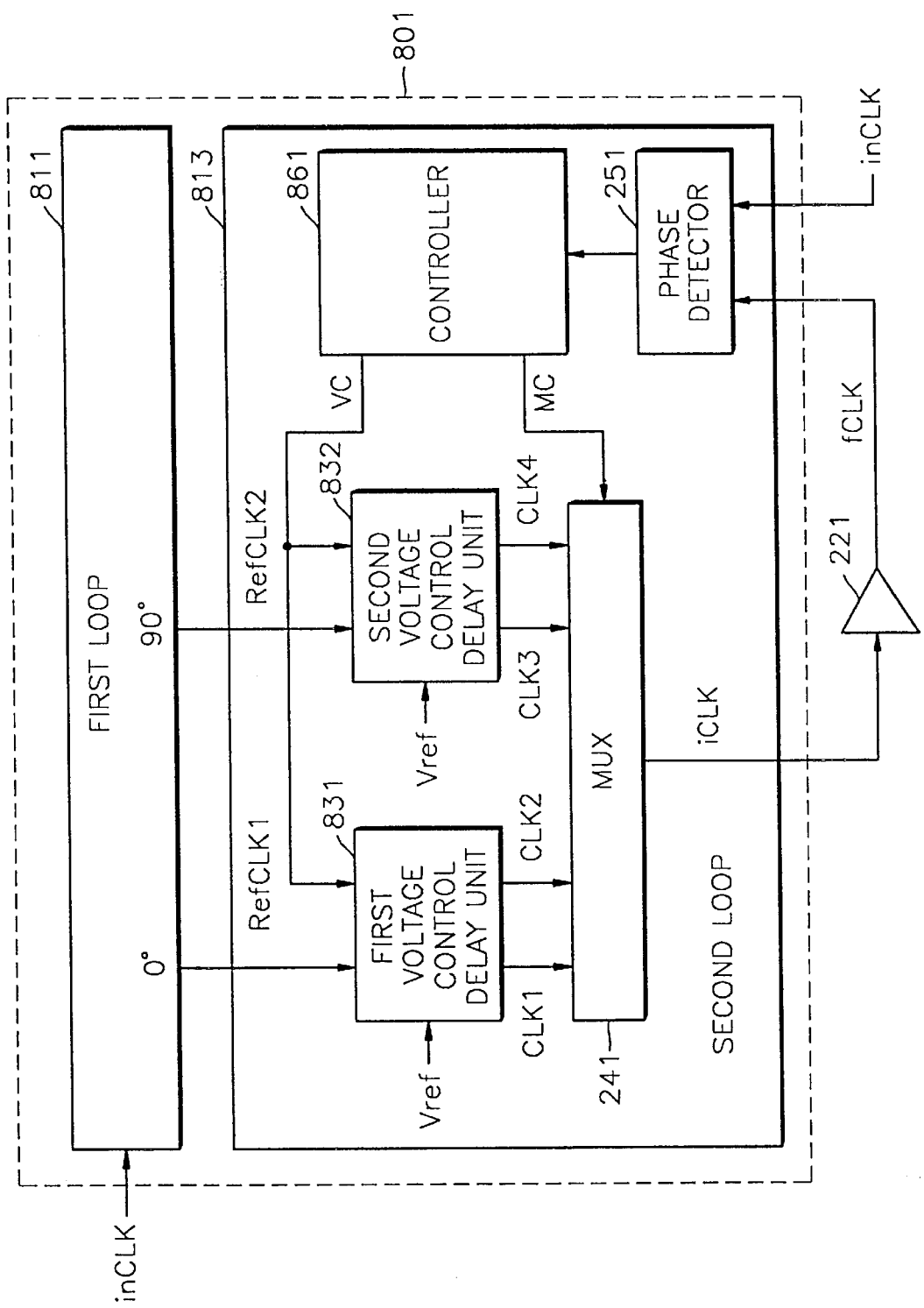
FIG. 8 is a block diagram of a clock synchronization circuit according to the second illustrative embodiment of the invention together with a clock buffer.

FIG. 8 is a block diagram of a clock synchronization circuit 801 according to the second illustrative embodiment of the invention together with a clock buffer 221. The same reference numerals of FIG. 8 as those of FIG. 2 denote the same elements. Referring to FIG. 8, a clock synchronization circuit 801 includes first and second loops 811 and 813. The first loop 811 generates first and second reference clock signals RefCLK1 and RefCLK2 having a phase difference of 90 degrees. The second loop 813 includes first and second voltage control delay units 831 and 832, a multiplexer 241, a phase detector 251 and a controller 861. The clock synchronization circuit 801 can perform the same function as the function of the clock synchronization circuit 201 shown in FIG. 2, since the first and second reference clock signals RefCLK1 and RefCLK2 applied to the first and second voltage control delay units 831 and 832 are differential signals and clock signals output from the first and second voltage control delay units 831 and 832 are also differential signals.

Figure 9:
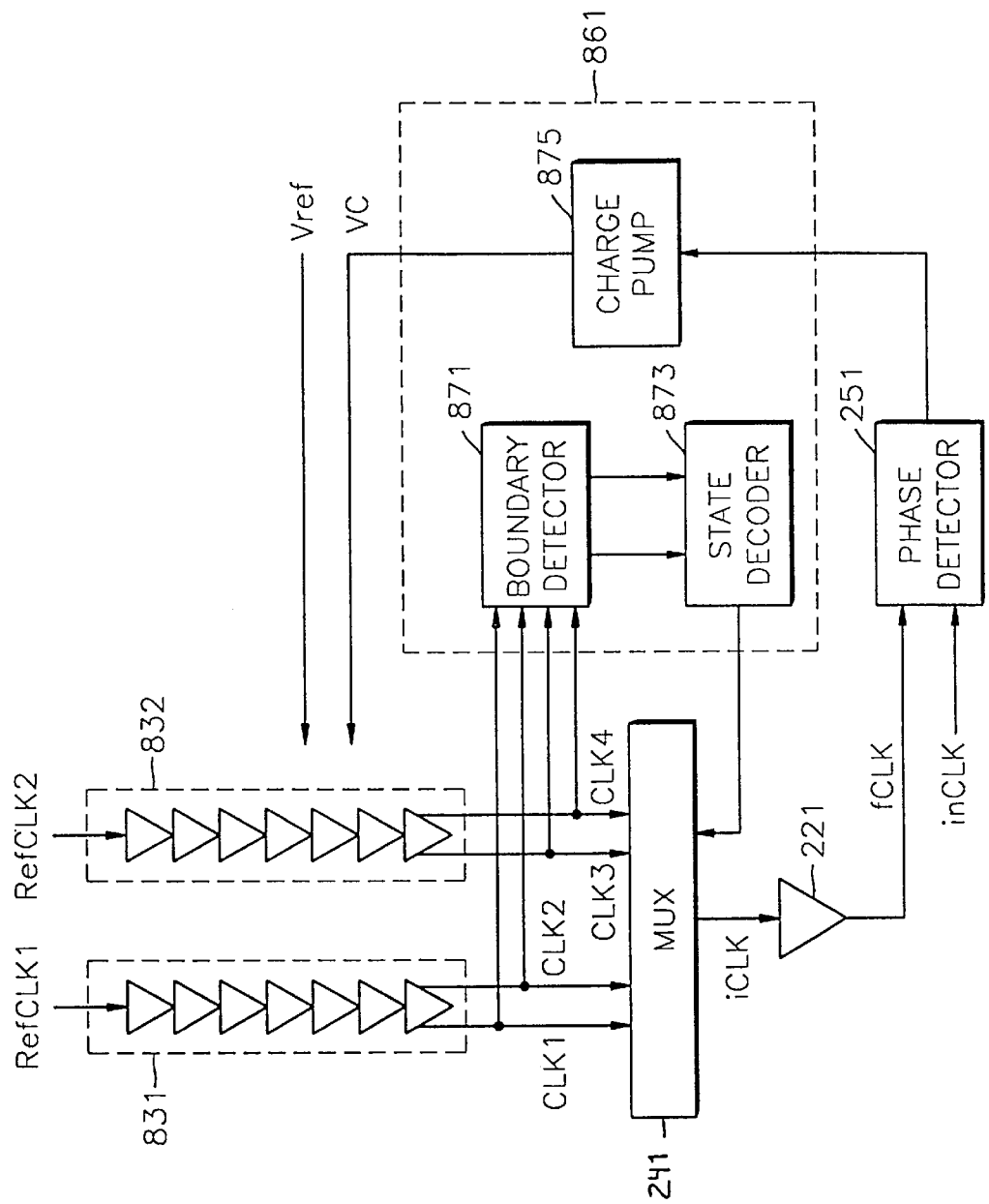
FIG. 9 is a block diagram illustrating the second loop of FIG. 8 in further detail according to an illustrative embodiment of the invention.

FIG. 9 is a block diagram illustrating the second loop 813 of FIG. 8 in further detail according to an illustrative embodiment of the invention. Referring to FIG. 9, the controller 861 includes a charge pump 875, a boundary detector 871 and a state decoder 873. Each of the first and second voltage control delay units 831 and 832 includes seven delay elements. A voltage control delay unit for outputting a selected clock signal iCLK, and a voltage control delay unit for outputting non-selected clock signals, are controlled by different voltages. If clock signals CLK3 and CLK4 output from the second voltage control delay unit 832 are selected, the second voltage control delay unit 832 is provided with a control voltage VC from the controller 861, while the first voltage control delay unit 831 is provided with a reference voltage Vref. The first voltage control delay unit 831 outputs first and second clock signals CLK1 and CLK2 of differential types having a 180° phase difference, and the second voltage control delay unit 832 outputs the third and fourth clock signals CLK3 and CLK4 of differential types having 90° phase differences with respect to the first and second clock signals CLK1 and CLK2, respectively.

The boundary detector 871 determines whether to increase or decrease a current selection code, using the phase relationship between the first through fourth clock signals CLK1 through CLK4. The state decoder 873 receives the output of the boundary detector 871 and determines a next selection code from the current selection code, so as to control the multiplexer 241. The output signal of the phase detector 251 drives the charge pump 875. The delay amount of a selected voltage control delay unit is controlled by the control voltage VC generated by the charge pump 875, and the delay amount of the other unselected voltage control unit is controlled by the reference voltage Vref.

Figure 10:
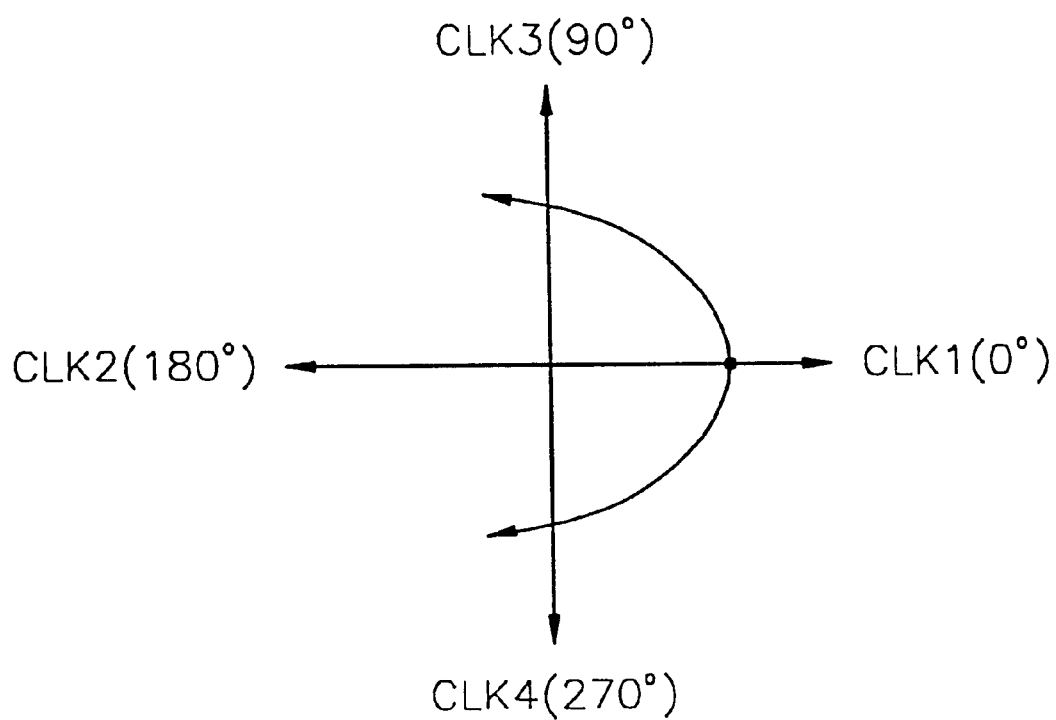
FIG. 10 is a phase diagram illustrating a delay control method performed by the second loop of FIG. 8 according to an illustrative embodiment of the invention.

FIG. 10 is a phase diagram illustrating a delay control method performed by the second loop 813 of FIG. 8 according to an illustrative embodiment of the invention. In the case where the first clock signal CLK1 is selected, when the first clock signal CLK1 is consistent with the third clock signal CLK3 having a 90° phase due to an increase in its delay amount, it is switched to the third clock signal CLK3. In the same case, when the first clock signal CLK1 is consistent with the fourth clock signal CLK4 having a 90° phase due to a decrease in its delay amount, it is switched to the fourth clock signal CLK4. Here, the first and second clock signals CLK1 and CLK2 maintain a 180° phase difference between them since they are differential signals, and the third and fourth clock signals CLK3 and CLK4 also maintain a 180° phase difference between them since they are differential signals. As described above, the delay range of the first clock signal CLK1 is between −90° and +90°, so that the clock synchronization circuit 801 provides a wider delay range than the delay range provided by the clock synchronization circuit 201 of the first embodiment (FIG. 2).

The clock synchronization circuit 801 can cover the entire phase region since continuous switching can be made at the clock boundary between two signals of the clock signals CLK1 through CLK4, similar to the clock synchronization circuit 201 shown in FIG. 2. In the clock synchronization circuit 801, each of the first and second voltage control delay units 831 and 832 has a greater number of delay elements than the number of delay elements included in each of the first through fourth voltage control delay units 231 through 234 in the clock synchronization circuit 201 of FIG. 2. However, the total number of delay elements in the clock synchronization circuit 801 is smaller than that of the delay elements in the clock synchronization circuit 201.

The clock synchronization circuits 201 and 801 according to the first and second embodiments of the present invention, respectively, can be realized in semiconductor devices, in particular, in SDRAM semiconductor devices.

As described above, the clock synchronization circuits 201 and 801 according to the present invention each having a dual loop include voltage control delay units 231 through 234 and voltage control delay units 831 and 832, respectively, such that the influence of dynamic noise is reduced and jitter performance is enhanced.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A clock synchronization circuit for synchronizing an external clock signal with an internal clock signal, the circuit being connected to a clock buffer adapted to output the internal clock signal, the circuit comprising:

a first loop adapted to receive the external clock signal and output a plurality of reference clock signals having a predetermined phase difference therebetween; and a second loop adapted to delay the plurality of reference clock signals, select a signal from among the plurality of delayed reference clock signals, provide the selected signal to the clock buffer, detect a phase difference between the internal clock signal output from the clock buffer and the external clock signal, generate a plurality of control voltages to reduce the detected phase difference, and control a delay amount of each of the plurality of reference clock signals in response to the plurality of control voltages, so as to synchronize the internal clock signal with the external clock signal.

2. The clock synchronization circuit of claim 1, wherein the clock synchronization circuit is comprised in a synchronous dynamic random access memory (SDRAM) semiconductor device.

3. The clock synchronization circuit of claim 1, wherein a level of one of the plurality of control voltages corresponding to the selected signal is different from levels of other of the plurality of control voltages corresponding to unselected signals among the plurality of delayed reference clock signals.

4. The clock synchronization circuit of claim 3, wherein the levels of the other of the plurality of control voltages are identical.

5. The clock synchronization circuit of claim 1, wherein the delay amount of each of the plurality of reference clock signals is always detected, the selected signal is switched to one of the unselected signals having a phase that lags a phase of the selected signal by 90° when the delay amount of the selected signal approaches a maximum value, and the selected signal is switched to one of the unselected signals having a phase that leads the phase of the selected signal by 90° when the delay amount of the selected signal approaches a minimum value.

6. A semiconductor device comprising:

a clock buffer adapted to output an internal clock signal suitable for internal use by the semiconductor device;

a first loop adapted to receive an external clock signal and output a plurality of reference clock signals having a predetermined phase difference therebetween; and a second loop adapted to delay the plurality of reference clock signals, select a signal from among the plurality of delayed reference clock signals, provide the selected signal to the clock buffer for conversion to the internal clock signal, detect a phase difference between the internal clock signal output from the clock buffer and the external clock signal, generate a plurality of control voltages to reduce the detected phase difference, and control a delay amount of each of the plurality of reference clock signals in response to the plurality of control voltages, so as to synchronize the internal clock signal with the external clock signal.

7. The semiconductor device of claim 6, wherein the semiconductor device is a synchronous dynamic random access memory (SDRAM) semiconductor device.

8. A clock synchronization circuit for synchronizing an external clock signal with an internal clock signal, the circuit being connected to a clock buffer, the circuit comprising:

a first loop adapted to receive the external clock signal and output first through fourth reference clock signals, consecutive pairs of the first through fourth reference clock signals having a 90° phase difference therebetween; and a second loop having first through fourth voltage control delay units adapted to delay the first through fourth reference clock signals, the second loop adapted to select a reference clock signal from among the first through fourth delayed reference clock signals, provide the selected reference clock signal to the clock buffer for conversion to the internal clock signal, detect a phase difference between the internal clock signal output from the clock buffer and the external clock signal, generate a plurality of control voltages having different levels according to the detected phase difference to reduce the detected phase difference, provide the plurality of control voltages to the first through fourth voltage control delay units, and control the delay amount of the selected reference clock signal in response to a control voltage from among the plurality of control voltages, so as to synchronize the internal clock signal with the external clock signal.

9. The clock synchronization circuit of claim 8, wherein a level of the control voltage applied to a voltage control delay unit among the first through fourth voltage control delay units that outputs the selected reference clock signal is different from levels of other control voltages from among the plurality of control voltages applied to other voltage control delay units among the first through fourth voltage control delay units that generate unselected reference clock signals.

10. The clock synchronization circuit of claim 9, wherein the levels of the other control voltages applied to the other voltage control delay units that generate the unselected reference clock signals are identical.

11. The clock synchronization circuit of claim 8, wherein delay amounts applied to the first through fourth reference clock signals are always detected, the selected reference clock signal is switched to an unselected one of the first through fourth delayed reference clock signals having a phase that lags a phase of the selected reference clock signal by 90° when the delay amount of the selected reference clock signal approaches a maximum value, and the selected reference clock signal is switched to an unselected one of the first through fourth delayed reference clock signals having a phase that leads the phase of the selected reference clock signal by 90° when the delay amount of the selected reference clock signal approaches a minimum value.

12. The clock synchronization circuit of claim 8, wherein ranges of the delay amounts of the first through fourth voltage control delay units are similar to each other.

13. The clock synchronization circuit of claim 8, wherein the clock synchronization circuit is comprised in a synchronous dynamic random access memory (SDRAM) semiconductor device.

14. A semiconductor device comprising:
a clock buffer adapted to output an internal clock signal suitable for internal use by the semiconductor device;
a first loop adapted to receive an external clock signal and output first through fourth reference clock signals having a 90° phase difference therebetween; and
a second loop having first through fourth voltage control delay units adapted to delay the first through fourth reference clock signals, the second loop adapted to select a reference clock signal among the first through fourth reference clock signals output from the first through fourth voltage control delay units and provide the selected reference clock signal to the clock buffer for conversion to the internal clock signal, detect a phase difference between the internal clock signal output from the clock buffer and the external clock signal, generate a plurality of control voltages having different levels according to the detected phase difference to reduce the detected phase difference, provide the plurality of control voltages to the first through fourth voltage control delay units, and control delay amounts of the first through fourth reference clock signals in response to the plurality of control voltages, so as to synchronize the internal clock signal with the external clock signal.

15. The semiconductor device of claim 14, wherein the semiconductor device is a synchronous dynamic random access memory (SDRAM) semiconductor device.

16. A clock synchronization circuit for synchronizing an external clock signal with an internal clock signal, the circuit being connected to a clock buffer, the circuit comprising:
a first loop adapted to receive the external clock signal and output first and second reference clock signals, the reference clock signals being differential signals having a 90° phase difference therebetween; and
a second loop having a first voltage control delay unit adapted to delay the first reference clock signal to output first and second differential clock signals, and a second voltage control delay unit adapted to delay the second reference clock signal to output third and fourth differential clock signals, wherein each of the first and second voltage control delay units is controlled by one of a reference voltage and a control voltage, the second loop adapted to select a differential clock signal among the first through fourth differential clock signals output from the first and second voltage control delay units, provide the selected differential clock signal to the clock buffer, detect a phase difference between the internal clock signal output from the clock buffer and the external clock signal, and provide the control voltage to one of the first and the second voltage control delay units according to the detected phase difference to reduce the detected phase difference, so that a delay amount of the selected differential clock signal is controlled, so as to synchronize the internal clock signal with the external clock signal.

17. The clock synchronization circuit of claim 16, wherein a level of the reference voltage is different from a level of the control voltage.

18. The clock synchronization circuit of claim 16, wherein delay amounts of the first through fourth differential clock signals are always detected, the selected differential clock signal is switched to an unselected one of the first through fourth differential clock signals having a phase that lags the phase of the selected clock signal by 90° when the delay amount of the selected differential clock signal approaches a maximum value, and the selected differential clock signal is switched to an unselected one of the first through fourth differential clock signals having a phase that leads the phase of the selected clock signal by 90° when the delay amount of the selected differential clock signal approaches a minimum value.

19. A semiconductor device comprising:
a clock buffer adapted to output an internal clock signal suitable for internal use by the semiconductor device;
a first loop adapted to receive an external clock signal and output first and second reference clock signals of differential types having a 90° phase difference therebetween; and
a second loop having a first voltage control delay unit adapted to delay the first reference clock signal to output first and second differential clock signals, and a second voltage control delay unit adapted to delay the second reference clock signal to output third and fourth differential clock signals, wherein each of the first and second voltage control delay units is controlled by one of a reference voltage and a control voltage, the second loop adapted to select a signal among the first through fourth differential clock signals output from the first and second voltage control delay units, provide the selected signal to the clock buffer for conversion to the internal clock signal, detect a phase difference between the internal clock signal output from the clock buffer and the external clock signal, and provide the control voltage to one of the first and the second voltage control delay units according to the detected phase difference to reduce the detected phase difference, so that a delay amount of the selected signal is controlled, so as to synchronize the internal clock signal with the external clock signal.

20. The semiconductor device of claim 19, wherein the semiconductor device is a synchronous dynamic random access memory (SDRAM) semiconductor device.

* * * * *